United States Patent [19]

Mazelsky et al.

[11] 4,102,767

[45] Jul. 25, 1978

[54] ARC HEATER METHOD FOR THE PRODUCTION OF SINGLE CRYSTAL SILICON

[75] Inventors: Robert Mazelsky, Monroeville; Maurice G. Fey, Plum Borough; Francis J. Harvey, Murrysville, all of Pa.

[73] Assignee: Westinghouse Electric Corp., Pittsburgh, Pa.

[21] Appl. No.: 787,635

[22] Filed: Apr. 14, 1977

[51] Int. Cl.² .................... B01K 1/00; C01B 33/02; C04B 35/00; H01L 3/00
[52] U.S. Cl. .................................. 204/164; 423/350; 252/62.3 E
[58] Field of Search ................ 204/164; 423/350; 252/62.3 E

[56] References Cited

U.S. PATENT DOCUMENTS

| 524,173 | 8/1894 | Jacques | 423/350 |
|---|---|---|---|
| 732,410 | 6/1903 | Homan | 423/348 |
| 2,904,404 | 9/1959 | Ellis | 423/350 |
| 2,955,966 | 10/1960 | Sterling | 204/164 X |
| 3,325,314 | 6/1967 | Allegretti | 423/350 X |
| 3,522,015 | 7/1970 | Maniero et al. | 250/530 X |
| 3,649,497 | 3/1972 | Kugler et al. | 204/164 |
| 3,963,838 | 6/1976 | Setty et al. | 427/213 |

FOREIGN PATENT DOCUMENTS

| 651,374 | 10/1962 | Canada | 423/350 |
|---|---|---|---|
| 1,041,483 | 10/1958 | Fed. Rep. of Germany | 423/350 |
| 1,129,145 | 5/1962 | Fed. Rep. of Germany | 423/350 |
| 855,913 | 12/1960 | United Kingdom | 423/350 |

Primary Examiner—F.C. Edmundson
Attorney, Agent, or Firm—L. P. Johns

[57] ABSTRACT

A method for the production of single crystal silicon characterized by the steps of feeding into an arc heater a quantity of uncontaminated silicon halide to react with hydrogen or a metal reductant, such as sodium, to produce reaction products including liquid silicon and a gaseous salt of the reductant, depositing the liquid silicon on a downwardly inclined surface, and attaching a single seed crystal of silicon to the liquid silicon and withdrawing the single seed crystal from the liquid silicon so as to propagate a large single crystal.

14 Claims, 5 Drawing Figures

ARC HEATER METHOD FOR THE PRODUCTION OF SINGLE CRYSTAL SILICON

CROSS-REFERENCE TO RELATED APPLICATIONS

This application is related to the applications Ser. No. 757,545, filed Jan. 6, 1977 by F. J. Harvey; Ser. No. 757,546, filed Jan. 6, 1977 by M. G. Fey and F. J. Harvey; Ser. No. 755,383, filed Dec. 29, 1976 by F. J. Harvey and M. G. Fey; and Ser. No. 787,634, filed Apr. 4, 1977 by M. G. Fey.

BACKGROUND OF THE INVENTION

1. Field of the Invention

This invention relates to a method for converting a silica-bearing starting material to single crystal silicon and, more particularly, it pertains to the production of liquid silicon in an arc heater under reduction conditions followed by single crystal growth.

2. Description of the Prior Art

The potential for photovoltaic energy conversion as a source for electric power generation is limited by the costs associated with the several processing steps of converting sand to single crystal silicon and hence to diffused, contacted and coated solar cells and arrays. The present process for manufacturing solar panels is a series of discrete steps, each of which is laborious and frequently wasteful of energy and materials. A national photovoltaic program is presently under way to reduce the cost of silicon solar cells and includes the development of processes to reduce raw material costs, develop more economic silicon processing procedures, and automating the processing.

SUMMARY OF THE INVENTION

In accordance with this invention it has been found that a satisfactory method for the production of single crystal silicon is available and comprise the steps of providing an arc heater having spaced electrodes and forming an arc chamber communicating with a reaction chamber, striking an electric arc in an axial gap between the electrodes, introducing an arc gas selected from the group consisting of hydrogen and a mixture of hydrogen and an inert gas through the gap to provide an elongated arc stream, feeding into the arc stream a reductant such as a metal and/or hydrogen, feeding into the arc stream a quantity of silicon halide to react with the reductant to produce reaction products including liquid silicon and a gaseous salt of the reductant, separating the liquid silicon from the gaseous salt of the reductant, depositing the liquid silicon on a downwardly inclinded surface, and attaching a single seed crystal of silicon to the liquid silicon and withdrawing the single seed crystal from the liquid silicon so as to propagate a large single crystal.

The advantage of the method of this invention is that there is a reduction in labor requirements as well as a decreased energy requirement. Moreover, the method provides increased flexibility in shape of the product.

DESCRIPTION OF THE PREFERRED EMBODIMENTS

In accordance with this invention the method for producing single crystal silicon is carried out as follows: providing an arc heater having spaced electrodes and forming an arc chamber communicating with a reaction chamber, striking an electric arc in an axial gap between the electrodes, introducing an arc gas selected from the group consisting of hydrogen and a mixture of hydrogen and an inert gas through the gap to provide an elongated arc stream feeding into the arc stream a quantity of a reductant selected from the group consisting of a metal, hydrogen, and a mixture thereof, feeding into the arc stream a quantity of silicon halide to react with the metal reductant to produce reaction products including liquid silicon and a gaseous salt of the metal reductant, separating the liquid silicon from the gaseous salt of the metal reductant, depositing the liquid silicon on a downwardly inclined surface, and attaching a single seed crystal of silicon to the liquid silicon and withdrawing the single seed crystal from the liquid silicon so as to propagate a large single crystal.

Figure 1:
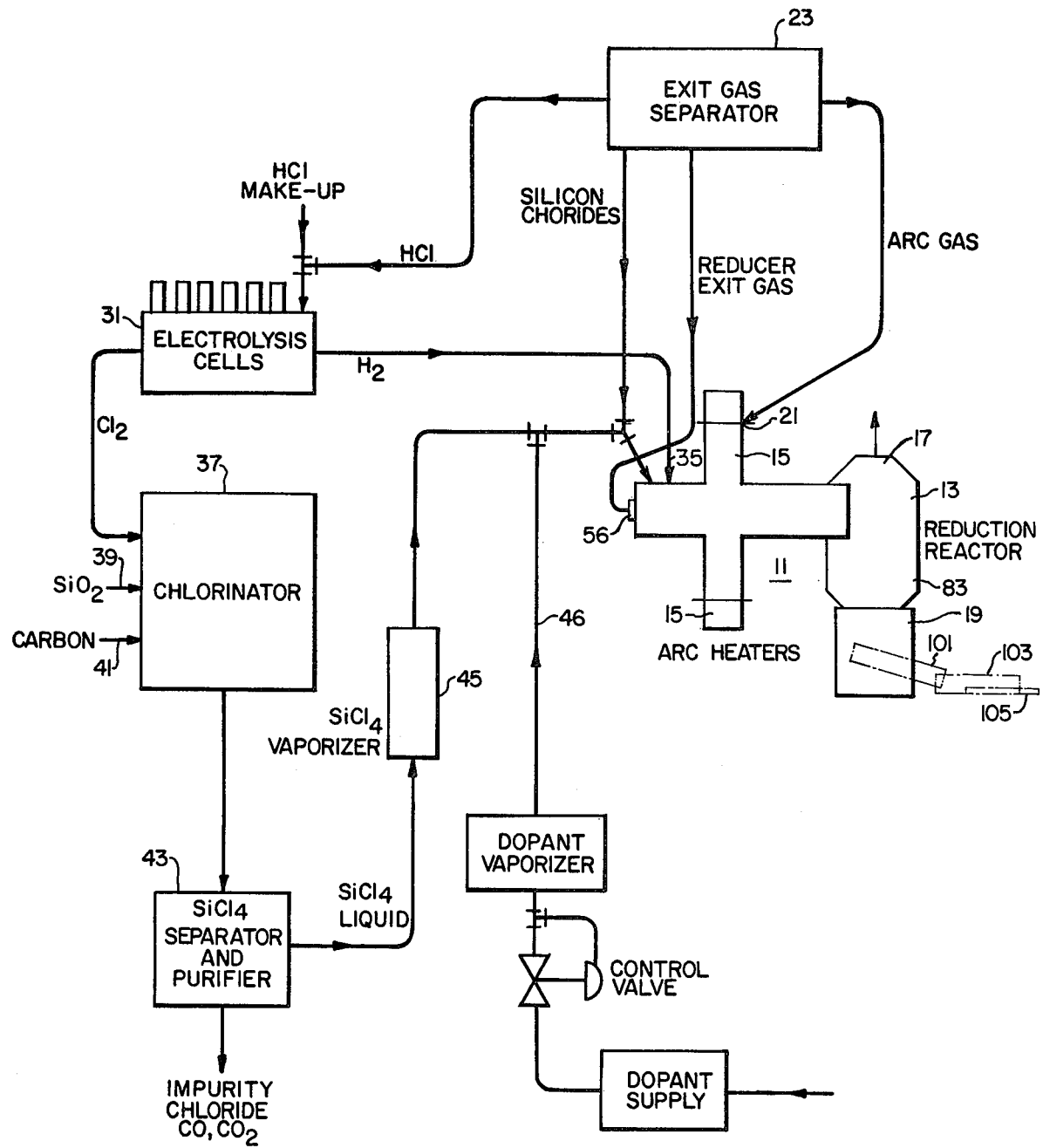
FIG. 1 is a flow sheet showing a process for the production of single crystal silicon.

The method may be carried out in a cyclonic reactor generally indicated at 11 in the drawings in FIG. 1 The reactor 11 is supported by associated structures. The reactor 11 comprises a reaction chamber 13, at least one and preferably a plurality of arc heaters 15, a first vent or outlet means 17 for co-product gases, and second vent or outlet means 19 for liquid silicon.

The arc gas is introduced into the system at an inlet 21 through the arc heaters 15 as will be set forth more particularly below. The arc gas together with the other co-products, such as HCl(g) and/or NaCl, leave the reactor through the outlet means 17 and are connected to a condenser type separator 23 for separating the arc gas and the co-product chlorides, the former of which is redirected into the arc heaters at inlet 21. The resulting co-product chloride leaves the separator 23 from where it is conducted to an electrolysis cell 31 for disassociation into hydrogen or metal and chlorine. The hydrogen or metal is transmitted to inlet 35 where it is introduced into the reactor 11. The chlorine from cell 31 is conducted to a chlorinator 37 where, together with a silica-bearing material is introduced at inlet 39 and a carbonaceous material such as coke, introduced at inlet 41 react with the chlorine to produce silicon tetrachloride impurity chlorides, and oxides of carbon. The mixture of gases that are produced in the chlorination proceed to the separator 43 where the silicon tetrachloride is purified. The silicon tetrachloride is moved to the vaporizer 45 and then to the reactor 11 at inlet 51.

Figure 2:
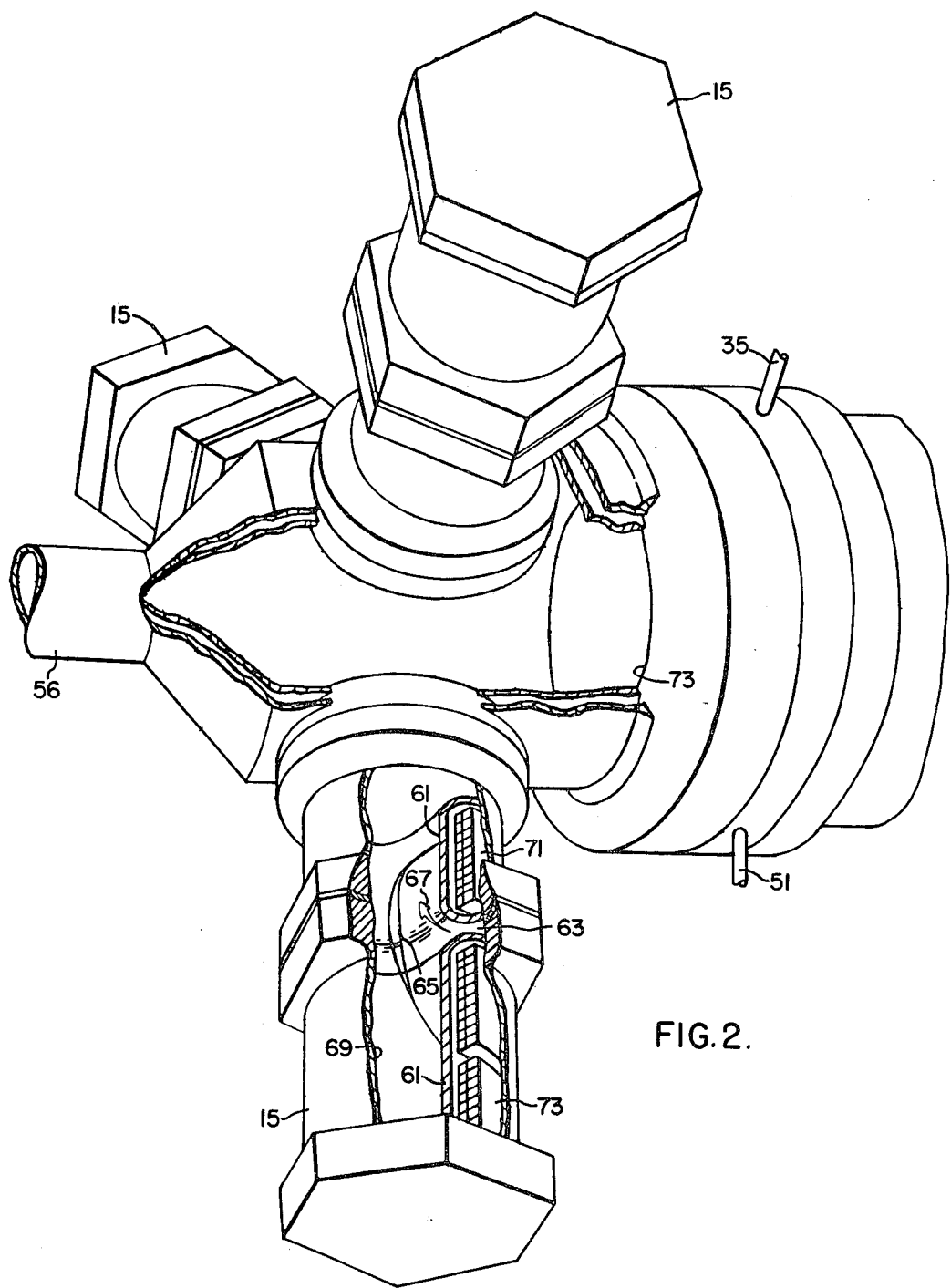
FIG. 2 is a perspective view with broken away portion showing a three-phase arc heater system.

As is shown in FIG. 2, one or more, and preferably three, arc heaters 15 are similar in construction and operation to that disclosed in U.S. Pat. No. 3,765,870, entitled "Method of Direct Or Reduction Using A Short Gap Arc Heater" of which the inventors are M. G. Fey and George A. Kemeny. Because of the full disclosure in that patent, the description of the arc heaters 15 is limited herein to the basic structure and operation. The arc heaters 15 (FIG. 2) are each a single phase, self-stabilizing AC device capable of power levels up to about 3,500 kilowatts, or up to about 10,000 kilowatts for a three-phase plant installation. In the practice of this invention, it is preferred that three arc heaters are provided, one for each of the three phases of the AC power supply.

The arc heater 15 has two annular copper electrodes 59, 61 which are spaced at 63 about 1 millimeter apart to accomodate a line frequency power source of about 4 kV. An arc 65 occurs in the space or gap 63 and incoming feed stock gas 67 immediately blows the arc 65 from the space into the interior or the arch chamber 69. The feed stock gas 67 must be compatible with the silicon and may be one of the gases selected from the group consisting of inert gas, hydrogen, silicon halides, and mixtures thereof. The arc 65 rotates at a speed of about 1000 revolutions per second by interaction of the arc currnt (several thousands amps AC) with a DC magnetic field set up by internally mounted field coils 71, 73. The velocities yield a very high operating efficiency for equipment of this type.

In case of metal reductions, droplets on particles of the metal are introduced at an inlet 56 and are entrained into the arc heated gas stream. The metal is selected from the group consisting of an alkali metal and an alkaline earth metal. For hydrogen reduction, all or part of the hydrogen may be introduced through the gap 63. Where only part is introduced through the gap 63, the remainder is introduced at the inlet 56.

Silicon halide is introduced through inlet ports 35, 51, preferably downstream of the electrodes 61.

In the alternative the silicon halide may be introduced at the inlet 56.

Figure 3:
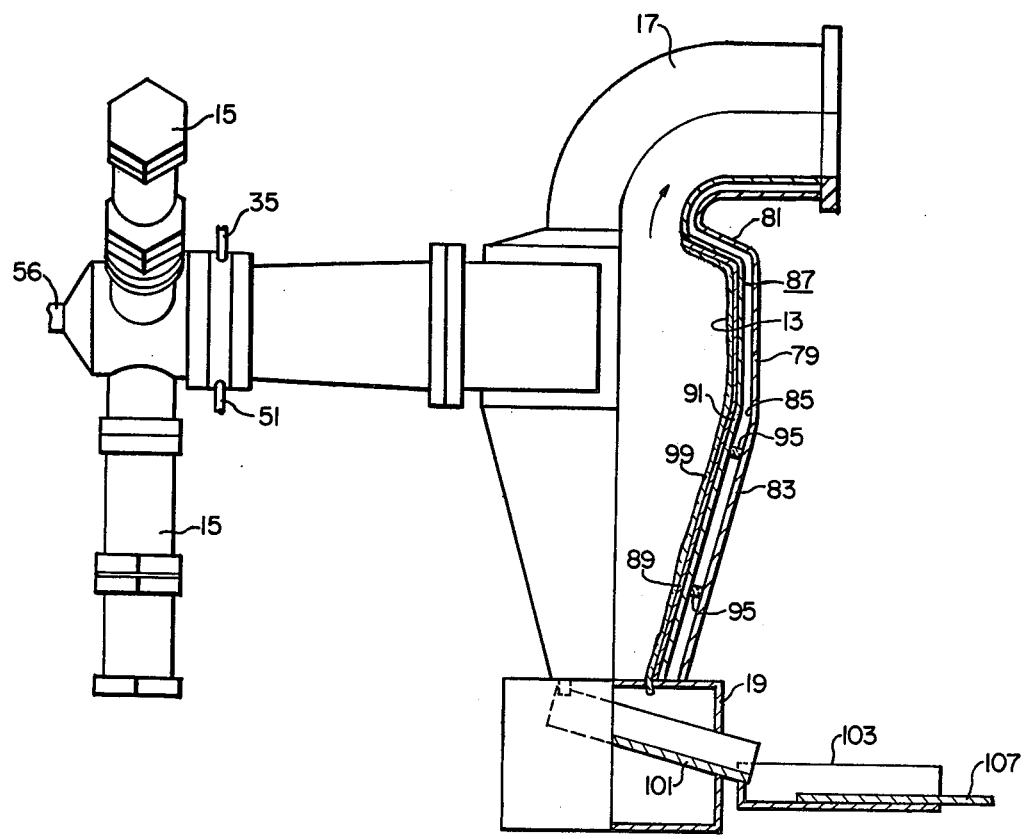
FIG. 3 is an elevational view showing an assembly of the arc heater system and a cyclone separator.

As shown in FIGS. 2 and 3, the arc heaters 15 are connected radially to the chamber 73 which is connected tangentially to the chamber 13. The chamber 13 is preferably cylindrical (FIG. 3) to enhance centrifugal separation of the liquid silicon and gaseous co-products of the foregoing reactions, whereby the gaseous products such as the hydrogen chloride, leave the reactor 11 via the outlet means 17 and the liquid silicon exits through the outlet means 19.

The chamber 13 is contained between a peripheral wall 79 and opposite end walls 81, 83. The upper end wall 81 is tapered upwardly from the wall 79 and joins the lower end of the outlet means 17 so that the co-product gases are more readily directed from the centrifugal zone within the chamber 13 towards the outlet means 17. Similarly, the lower end wall 83 is inclined downwardly, and as shown in FIG. 3, joins the outlet means 19. The peripheral wall 79 and end walls 81, 83 are preferably cooled by water jacket means 85 of a conventional type.

The chamber 13 comprises an inner wall or liner 87 which is substantially concentrically disposed and spaced from the peripheral wall 79 and the end walls 81, 83. The wall 87 preferably comprises interior inner wall 89 and an exterior inner wall 91. The spacing 93 between the walls 79, 81, 83 and the inner wall 87 is maintained in a suitable manner such as by spaced ceramic support rings 95 (FIG. 3) as the water jacket means 85.

The inner wall means including the wall 87 operates at high temperatures where silicon is the product of the reaction within the chamber 13. As the liquid silicon separates centrifugally from the co-product gases, the liquid silicon deposits a solidified silicon layer 99 which is formed on the interior inner wall 89 and has a thickness which is established by heat transfer. Subsequent liquid silicon flows downward through the lower end of the chamber 13. In view of the high temperature involved within the chamber 13, the interior inner wall 89 is composed of high temperature materials, such as carbon, molybdenum, or silicides thereof. The exterior inner wall 91 is composed of refractory insulation materials, such a $Al_2O_3$, $SiO_2$, and $MgO$.

The following example is illustrious of the invention:

EXAMPLE

A suggested example of the process is the hydrogen reduction of silicon tetracholoride. The reaction resulting in the formation of liquid silicon is $$SiCl_4(G) + 2H_2(g) \rightarrow Si(l) + 4HCl(g)$$

In addition to liquid silicon and other silicon chlorides, silicon hydrides and chlorosilones may form as the result of reaction between silicon tetrachloride and hydrogen. The formation of these other species would result in a yield of liquid silicon of less than 100%. Calculation of the complex equilibria in the silicon-hydrogen-chlorine system have shown that in the temperature range between 1800° K and 2400° K the maximum yield occurs at 2200° K. In particular, these calculations have shown that at 2200° K and one atmosphere total pressure the minimum theoretical hydrogen requirement is approximately 940 SCF (Standard Cubic Feet) per pound of silicon and the minimum theoretical energy requirement is about 26 Kw-hr/lb Si for a feedstream containing 25 mols of hydrogen per mol of silicon tetrachloride.

As the liquid silicon flows from the lower end of the wall 91 (FIG. 3), it drops onto an inclined chute 101. The liquid silicon, being at 1700° C, flows from the chute 101 onto a sheet mold 103 which is inclined downwardly (FIG. 4) at an angle 105 at an inclination of about 1° to 2°. Both the chute 101 and the sheet mold 103 are lined with silica to avoid contamination and are contained in an enclosure (not shown) to maintain a controlled atmosphere of a gas, such as argon or helium, to prevent oxidation and for containing an auxiliary heater.

The liquid silicon solidifies on the surface of the mold 103 into a polycrystalline sheet 104. As the sheet 104 moves to the right end of the mold 103 (FIG. 4), it enters a narrow reheating zone 106 as provided by a focused line heat source, such as an electron beam or laser beam. The remelted silicon sheet is then controllably solidified onto a single crystal seed to propagate an elongated single crystal in sheet form 107. The procedures by which the single crystal is grown comprise directional solidification techniques, as well as the zone technique. Generally, at a point near the solidification temperature a shaped single crystal is placed in contact with the liquid silicon. Supplemental heating is supplied at 106, such as a laser beam, electron beam RF, focused halogen vapor lamp, or other controllable indirect means, and a crystal is propagated. Because of the highly sophisticated heat flow control required, auxiliary heaters and/or insulation is required to propagate satisfactory crystals.

Figure 4:
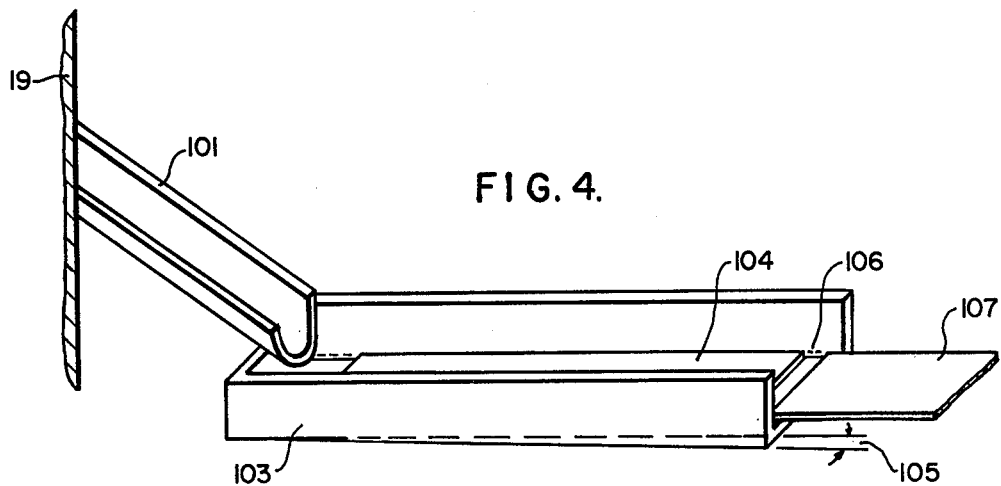
FIG. 4 is an isometric view showing means for producing single crystal silicon having a flat sheet configuration.
Figure 5:
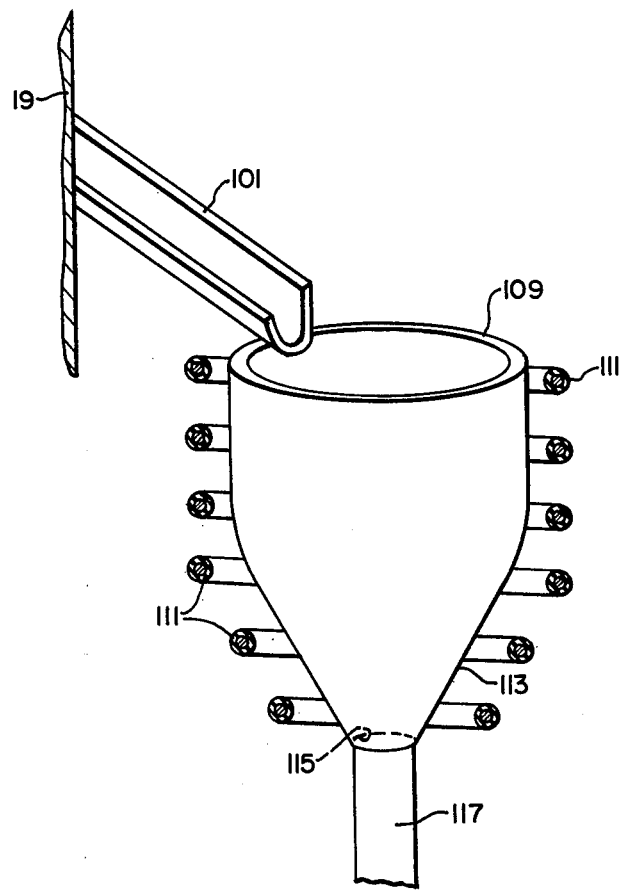
FIG. 5 is an isometric view showing means for producing single crystal silicon having a rod-like configuration.

Another embodiment of the invention is shown in FIG. 5 in which the silica-lined chute of FIG. 4 empties into a silica-lined crucible 109. A suitable heater, such as an induction coil 111, surrounds the crucible. The lower side 113 is tapered to a lowermost end where an outlet opening 115 is located for the withdrawal of solidified silicon having the shape of the opening. A single crystal seed 117 is employed to controllably solidify the silicon to form an elongated single crystal. In the alternative the outlet opening 115 may be eliminated and an elongated single crystal may be drawn from the top of the liquid silicon in the crucible.

For the foregoing growth of crystals the crystal growing techniques of Czochrolski, edge defined film growth, Dendritic web growth, Stepanov, Stockbarger, as well as the zone technique, can be used with appropriate construction for adaption to the particular method of this invention. Thus, single crystals of varying cross-sectional area are produced.

In summary, in the proposed process a silica-bearing starting material is converted to liquid silicon by an arc heater based reduction and then directly grown into single crystal by one of the methods outlined above. The advantages of the proposed process over the prior art include:

(1) The required handling of the silicon between the production of polycrystalline silicon and the growth of the single crystal is eliminated, thus the process herein disclosed in amenable to large volume, low cost continous production techniques. In prior methods, a waiting period is required until the silicon cools and labor intensive steps such as packaging, transporting, and setting up at the crystal growing apparatus were necessary. If the silicon is open to air during this process, evacuating and/or inert gas purging is required before single crystal growth, and these complicated and involved processed steps result in substantial incremental production costs.

(2) The energy requirement is reduced because the silicon is not cooled to room temperature prior to the single crystal growth process. In the case that the crystal is grown directly from liquid silicon, the energy required for remelting is saved. The efficiency of heating silicon from room temperature to the molten state is estimated to be on the order of 30%, thus the energy saving over prior art is expected to be on the order 1200 kw.hr. per ton of silicon. If the silicon produced by the arc heater technique is solidified before single crystal processing, then, of course, the energy saving will be less.

(3) More desirable shapes for the single crystal step can be obtained when the process is carried out using the option in which the silicon is cooled to room temperature prior to growth. The various growth methods require different shapes such as slim rod, discs, chips, etc. In the proposed process, the liquid silicon from the arc heater reduction step can be readily cast into the desired shape by directing the flow into an appropriate mold.

Accordingly, the reactor of the present invention provides for a unique assembly of an arc heater and reaction chamber which permits separation of the product silicon from the co-products' gases. Such as assembly is suitable for either single-phase or three-phase operation and capable of continuous operation at high production rates.

What is claimed is:

1. A method for producing single crystal silicon comprising the steps of:
   (a) providing an arc heater having spaced electrodes and forming an arc chamber communicating with a reaction chamber,
   (b) striking an electric arc in an axial gap between the electrodes,
   (c) introducing an arc gas selected from the group consisting of hydrogen and a mixture of hydrogen and an inert gas through the gap to provide an elongated arc stream,
   (d) feeding into the arc stream a quantity of a reductant selected from the group consisting of an alkali metal, an alkaline earth, hydrogen, and a mixture thereof,
   (e) feeding into the arc stream a quantity of silicon halide to react with the reductant to produce reaction products including liquid silicon and a gaseous salt of the reductant,
   (f) separating the liquid silicon from the gaseous salt of the reducant in the reactive chamber,
   (g) depositing the liquid silicon on a downwardly inclined surface, and
   (h) attaching a single seed crystal of silicon to the liquid silicon and withdrawing the single seed crystal from the liquid silicon so as to propagate a large single crystal.

2. The method of claim 1 wherein three arc heaters are provided in peripherally spaced positions around a chamber.

3. The method of claim 1 wherein the reductant is sodium.

4. The method of claim 1 wherein the reductant is magnesium.

5. The method of claim 1 wherein the reductant is potassium.

6. The method of claim 1 wherein silicon tetrachloride is fed in step (e).

7. The method of claim 1 wherein silicon tetraiodide is fed in step (e).

8. The method of claim 1 wherein silicon tetrabromide is fed in step (e).

9. The process of claim 1 wherein silicon tetrafluoride is fed in step (e).

10. The method of claim 6 wherein sodium is fed in step (d).

11. The method of claim 6 wherein potassium is fed in step (d).

12. The method of claim 6 wherein magnesium is fed in step (d).

13. The method of claim 1 wherein silicon-bearing material is halogenated to produce a silicon halide, and which silicon halide is purified prior to step (e).

14. The method of claim 1 wherein in step (g) the liquid silicon is deposited centrifugally on a downwardly inclined surface to cause separation of the liquid silicon and the salt of the metal reductant.

* * * * *